United States Patent [19]

Murata et al.

[11] Patent Number: 4,808,242

[45] Date of Patent: * Feb. 28, 1989

[54] PHOTOVOLTAIC DEVICE AND A METHOD OF MANUFACTURING THEREOF

[75] Inventors: Kenji Murata; Yasuo Kishi, both of Osaka, Japan

[73] Assignee: Sanyo Electric Co., Ltd., Japan

[*] Notice: The portion of the term of this patent subsequent to Feb. 23, 2005 has been disclaimed.

[21] Appl. No.: 115,693

[22] Filed: Nov. 2, 1987

[30] Foreign Application Priority Data

Nov. 7, 1986 [JP] Japan .................................. 61-265811

[51] Int. Cl.$^4$ ....................... H01L 27/14; H01L 31/18
[52] U.S. Cl. ................................... 136/244; 136/249; 136/258; 437/2; 437/4; 437/51; 437/205
[58] Field of Search ....................... 437/2, 4, 51, 205; 136/244, 256, 258 AM, 249 MS

[56] References Cited

U.S. PATENT DOCUMENTS 4,697,041  9/1987  Okaniwa et al. ..................... 136/244
4,726,849  2/1988  Murata et al. ....................... 136/244

FOREIGN PATENT DOCUMENTS 59-125668  7/1984  Japan ................................... 136/256

*Primary Examiner*—Aaron Weisstuch
*Attorney, Agent, or Firm*—Darby & Darby

[57] ABSTRACT

A photovoltaic device includes a substrate on which a plurality of transparent electrodes for each photoelectric conversion cell are arranged. On each transparent electrode, a coupling conductor and a plurality of collecting electrodes connected to the coupling conductor are formed. On the substrate, an insulator layer is further formed, which includes a first portion extending in parallel with the coupling conductor and second portions covering the collecting conductors. A semiconductor photo-active layer and a back electrode are formed in this order so as to cover the respective components previously formed. By irradiating a laser beam onto the respective first portions above the back electrodes, the irradiated part of the back electrode and the semiconductor photo-active layer thereunder are separated into the respective photoelectric conversion cells. By irradiating the laser beam onto the respective second portions above the back electrode, the irradiated part of the back electrode and the semiconductor photo-active layer thereunder are melted, and the back electrode of each photoelectric conversion cell is connected to the adjacent transparent electrode through the coupling conductor.

26 Claims, 11 Drawing Sheets

THICKNESS OF a-Si GROUP SEMICONDUCTOR FILM (Å)

PRIOR ART

PHOTOVOLTAIC DEVICE AND A METHOD OF MANUFACTURING THEREOF

BACKGROUND OF THE INVENTION

1. Field of the Invention

The present invention relates to a photovoltaic device and a method of manufacturing thereof. More specifically, the present invention relates to a so-called series type photovoltaic device wherein a plurality of series connected photoelectric conversion cells composed of semiconductor layer such as amorphous silicon are arranged along the length of a single substrate, and a method of manufacturing thereof.

2. Description of the Prior Art

This kind of photovoltaic device is disclosed, for example, in U.S. Pat. No. 4,281,208, assigned to the same assignee as the present invention. A brief description will be given here of the structure of this photovoltaic device shown in FIG. 1 within the context required for understanding the present invention.

A plurality of photoelectric conversion cells 2a 2b, 2c,—are formed on a glass substrate 1. Transparent electrodes 3a, 3b, 3c, — are formed with a constant interval between adjacent photoelectric conversion cells 3a, 3b, 3c, —. On the respective transparent electrodes 3a, 3b, 3c, —, semiconductor photo-active layers 4a, 4b, 4c, — are formed, which are composed of amorphous silicon or the like. On the semiconductor photo-active layers 4a, 4b, 4c, —, back electrodes 5a, 5b, 5c, — are formed, the ends of which extend to the adjacent transparent electrodes 3b, 3c, — to be connected thereto.

The semiconductor photo-active layers 4a, 4b, 4c, — comprise, for example, PIN junctions parallel with the film surfaces, and when the light enters into them through the glass substrate 1 and the transparent electrodes 3a, 3b, 3c, — photovoltages are generated in the respective semiconductor photo-active layers 4a, 4b, 4c, —. The photovoltages generated in the respective photoelectric conversion cells 2a, 2b, 2c, — are added in series because the back electrodes 5a, 5b, 5c, — are connected to the adjacent transparent electrodes 3b, 3c, —.

Normally, in order to manufacture a photovoltaic device of such a structure, a photo-etching technique is employed for its micro-workability. In the case of employing the photo-etching technique, with reference to the example shown in FIG. 1, a transparent electrode layer is formed on the whole of one main surface of the glass substrate 1, and photo-resist films are formed on the parts corresponding to the semiconductor photoactive layers 4a, 4b, 4c, —, and then etching is performed and thereafter the photo-resist films are removed, and thereby the semiconductor photo-active layers 4a, 4b, 4c, — for the respective photoelectric conversion cells 2a, 2b, 2c, — are formed.

Such a photo-etching technique excels in microworkability, but is likely to produce defects in the semiconductor photo-active layer due to pinholes produced in the photo-resist film defining the etching pattern, peeling-off at the fringe of the photo-resist film, etc..

Subsequently, a method not employing photo-etching techniques was proposed, for example, in U.S. Pat. No. 4,292,092 issued on Sept. 29, 1981. In this Patent, a laser beam is employed. This method which performs patterning by irradiating the laser beam is extremely effective in that micro-working can be performed without employing any wet processing.

However, conventional working by means of laser irradiation has the following problems to be solved. Specifically, the working by the laser beam is essentially a thermal working, and therefore if another layer is present under the part of layer to be worked, it is important not to damage it. Otherwise, in addition to burning-off the desired part of the layer, the under layer not required to be burnt-off is also burnt-off, or if not so, it thermally damaged. In U.S. Pat. No. 4,292,092 as cited above, in order to meet this requirement, it is proposed that the laser output or the pulse frequency is selected specifically for each film or layer to be worked.

However, even by this prior art method, the workability is still insufficient because of variations of the film thickness of the semiconductor photo-active layer which are inevitably present. Specifically, the absorption factor of the laser beam varies greatly depending upon the thickness of the film or layer to be worked, and therefore the threshold energy density of the laser for scribing is not always constant. For example, in the case of amorphous silicon, the relationships of absorption factor A, reflection factor R, and transmission factor T of the laser beam to the film thickness are as shown in FIG. 2. As is obvious from FIG. 2, for example, in the case of working amorphous silicon films by a Nd:YAG laser of 1.06 μm wavelength with Q switching, the absorption factor of the laser radiation varies greatly within a range of 5%—20% at a film thickness of 4000 Å or more which is practicable for the photovoltaic device. Accordingly, in the case of working amorphous silicon films by such a YAG laser, when a high laser output is used so as to scribe effectively even if the film thickness is such to give a minimum absorption factor of 5%, a laser beam having an output of four times the threshold energy density is irradiated onto those parts of the film having a thickness corresponding to a maximum absorption factor of 20%. Accordingly, thermal damage to the transparent electrode present under such parts of the amorphous silicon film is unavoidable. Conversely, when a low laser output is employed so that those parts of the film having a thickness corresponding to an absorption factor of 20% can be worked, the laser energy is insufficient at those parts of the film having a thickness corresponding to an absorption factor of 5%. Accordingly, amorphous silicon at those parts is not removed, and remains uncut, resulting in a reduction in output of the photoelectric conversion cell.

Thus, one problem in U.S. Pat. No. 4,292,092 is that since the absorption factor of the laser beam varies greatly depending upon the film thickness of the amorphous silicon film, partial thermal damage is given to the under-layered transparent electrode or the amorphous silicon film at those parts which remain uncut.

U.S. Pat. No. 4,292,092 has another problem as follows: In general, a metal film having a high heat conductivity such as an aluminum, silver or the like is employed for the back electrode in such a photovoltaic device. In the case where the laser beam is irradiated onto such a back electrode of aluminum, various disadvantages described in the following are caused since the working conditions are stringent.

For example, as shown in FIG. 3, in the case of a structure wherein the back electrode on the transparent electrode exposed by the semiconductor photo-active layer is separated, for example, the back electrode 5b on the semiconductor photo-active layer 4b is melted due to heating by a laser beam of large output, and a melted part 5ab flows onto the transparent electrode 3b, causing the photoelectric conversion cell 2b to short-circuit. Also, as shown in FIG. 4, in the case of a structure wherein the back electrode on the underlying semiconductor photo-active layer is separated, the parts of the semiconductor photo-active layer 4b bombarded directly by the laser beam of large output are annealed, and the resistance at those parts 4b' is lowered. Consequently, the back electrode 5a and 5b which may be separated physically from each other are not separated electrically because of the low resistance of the part 4b' of the semiconductor photo-active layer 4b', and accordingly, the open-circuit voltage Vcc of the whole photovoltaic device is reduced.

Another laser-beam technique capable of solving one of the problems of U.S. Pat. No. 4,292,092 is disclosed, for example, in U.S. Pat. No. 4,517,403 issued on May 14, 1985. In this Patent, the back electrode of each photoelectric conversion cell is connected in series to the adjacent transparent electrode through silver paste buried in the amorphous silicon. In this Patent, the amorphous silicon layer is not required to be scribed, and therefore the first problem of U.S. Pat. No. 4,292,092 is avoided, namely the problem caused by variation of the laser beam absorption factor due to variation of the film thickness of the amorphous silicon layers. However, this Patent still does not solve the second problem of U.S. Pat. No. 4,292,092, namely scribing of the back electrode.

Also, in U.S. Pat. No. 4,668,840 issued on May 6, 1987, it is proposed to insert a heat insulating material between the back electrode and the semiconductor photo-active layer in order to remove the deleterious heating effect due to laser-scribing of the back electrode. This U.S. Pat. No. 4,668,840, is characterized in that no damage is given to the underlying semiconductor photo-active layer or the like even when a laser beam of a relatively large output is employed in scribing the back electrode. However, U.S. Pat. No. 4,668,840 gives no consideration to the change in absorption factor due to the variation of film thickness because the semiconductor photo-active layer itself has been already scribed in the previous process, still leaving the first problem of U.S. Pat. No. 4,292,092.

On the other hand, aforementioned transparent electrodes 3a, 3b, 3c, — are normally composed of transparent conductive oxide(TCO) typified by tin oxide($SiO_2$), indium oxide($In_2O_3$) or indium tin oxide(ITO). The sheet resistance of such a TCO is approximately 30–50 ohms/$cm^2$ which is more than three-times that of a metal such as aluminum, gold, silver or the like, and therefore, it is known that an electric power loss is caused in the transparent electrodes 3a, 3b, 3c, —. In order to reduce such an electric power loss in the transparent electrodes 3a, 3b, 3c, —, the assignee of the present invention has proposed a structure in which a plurality of strip collecting conductors having good electric conductivity are formed on a whole area of the transparent electrodes composed of TCO in, for example, Japanese Patent Laying-Open No. 130977/1981 laid open on Oct. 14, 1981.

In such a proposed structure, the composite sheet resistance of the collecting conductors and the transparent electrodes becomes small and thus the electric power loss is reduced; however, since the collecting conductors are laminated on the transparent electrode the bottom surface of the semiconductor photo-active layer becomes uneven and thickness of the portions of the semiconductor photo-active layer above the collecting conductors become thin, and therefore, accidental short-circuits occur when the collecting conductors penetrate the semiconductor photo-active layer and then contact the back electrode.

Therefore, the assignee of the present invention has further proposed to arrange an insulator film on the collecting conductors for preventing the above described short-circuit accident in, for example, Japanese Patent Laying-Open No. 125668/1984 laid open on July 20, 1984.

However, in such a structure in which the insulator film is arranged on the collecting conductors, if the thickness of the collecting conductors is made large to further reduce the above described composite sheet resistance, the thickness of the collecting conductors penetrating the semiconductor photo-active layer becomes large and thus the side surfaces of the collecting conductors are exposed, and consequently the side surfaces of the collecting conductors come into contact with the back electrode. This means that accidental short-circuits cannot be completely prevented even with such a structure. Also, even if accidental shortcircuits are prevented, since the side surfaces of the collecting conductors directly contact the semiconductor photo-active layer, metal of the conductors, such as aluminum, silver or the like is diffused into the semiconductor photo-active layer, and subsequently a deterioration of a film quality of the semiconductor photo-active layer takes place.

SUMMARY OF THE INVENTION

Therefore, a principal object of the present invention is to provide a photovoltaic device having collecting electrodes of a novel structure which can be worked effectively and stably by utilizing an energy beam.

Another object of the present invention is to provide a photovoltaic device having collecting electrodes wherein separation of the semiconductor photo-active layer and the back electrode and series connection between the back electrode and the transparent electrode can be stably performed.

Still another object of the present invention is to provide a photovoltaic device having collecting electrodes wherein separation of the semiconductor photo-active layer and the back electrode and series connection between the back electrode and the transparent electrode can be performed virtually in the same process.

Still another object of the present invention is to provide a photovoltaic device having collecting electrodes which do not require precise adjustment of the energy density or the like of energy beam during working.

Still another object of the present invention is to provide a photovoltaic device having collecting electrodes wherein no accidental short-circuits and deterioration of the quality of the semiconductor photoactive layer take place.

Another object of the present invention is to provide a simple method of manufacturing a photovoltaic device having collecting electrodes.

The present invention is directed to a photovoltaic device of the type including a plurality of photoelectric conversion cells formed as an array on a substrate having an insulating surface, each cell including a first electrode, an active semiconductor layer, and a second electrode. The array comprises a plurality of spaced apart first electrode layers formed on said insulating surface of said substrate so as to define a plurality of separate photoelectric conversion cells, each of said first electrode layer including a transparent electrode, a coupling conductor formed in a coupling region on the transparent electrode, and a collecting conductor extending from the coupling conductor over the surface of the transparent electrode; an insulator layer including a first portion formed on a dividing region for dividing into said plurality of photoelectric conversion cells and a second portion formed on said substrate; a semiconductor photo-active layer formed on said substrate so as to cover said first electrode layers and said insulator layers; and a second electrode layer formed on said semiconductor photoactive layer, wherein, said semiconductor photo-active layer and said second electrode layer are separated to define each photoelectric conversion cell by irradiating a first energy beam onto said insulators from above said second electrode, and the second electrode of each photoelectric conversion cell being connected to the transparent electrode of the first electrode layer of an adjacent photoelectric conversion cell through said electrical conductor by irradiating a second energy beam onto each said conductor from above each said second electrode.

In accordance with the present invention, in separating the second electrode and the semiconductor photo-active layer for each photoelectric conversion cell, separation can be made stably and perfectly without being affected by the film thickness of the semiconductor photo-active layer. In detail, the first portion of the insulator layer is disposed under the semiconductor photo-active layer, and in the separating process thereof, an energy beam is irradiated onto this insulator portion, and therefore, even if the output of the energy beam is set so as to be able to scribe those parts of the semiconductor photo-active layer of film thicknesses at which the absorption factor for the energy beam is small, the first portion of the insulator layer prevents the energy beam from reaching the underlying transparent electrode, and therefore no thermal damage is given to such an underlying transparent electrode. Accordingly, the present invention is completely free from the conventional problem that the underlying electrode is affected adversely by the variation in the threshold energy density due to variation of the film thickness of the semiconductor photo-active layer and is also free from the problem that the semiconductor photo-active layer cannot be separated completely because of the lack of energy. Consequently, fine adjustment of the energy density of the energy beam to be irradiated can be dispensed with, thus simplifying the manufacturing process.

Also, the first portion of the insulator layer can effectively prevent the adjacent second electrodes or the back electrodes from short-circuiting to each other. Specifically, even if the second electrode is caused to melt by the energy beam used for separating each photoelectric conversion cell, the first portion can prevent this melting from spreading to other parts, and therefore it never happens that the second electrodes are connected to each other through the melted portion.

In a preferred embodiment in accordance with the present invention, the coupling conductor extends in the direction of width of the transparent electrode, and is formed so that the end thereof in the direction of width is positioned inside from the edge of the transparent electrode. On the other hand, the first portion of the insulator layer extends in the direction of width of the transparent electrode, and is formed so that the end thereof is positioned outside the edge of the transparent electrode. In accordance with this embodiment, no short-circuit is caused between the adjacent photoelectric conversion cells.

In more detail, in the case where the transparent electrode is formed on the whole surface of the substrate, and thereafter the transparent electrode is separated to define each photoelectric conversion cell, for example, by the laser beam, the adjacent transparent electrodes are not separated completely because of the transparent electrodes material remaining on the side edge of the substrate, and accordingly, if the coupling conductor contacts the remainder, sometimes the coupling conductors are also connected electrically to each other through this part. However, in accordance with this embodiment, the coupling conductor does not extend beyond the edge of the first electrode, and therefore it never contacts the remaining transparent electrode, and accordingly, no problem is caused that the coupling conductors between the adjacent photoelectric conversion cells are connected electrically to each other. Also, since the edge of the transparent electrode in the direction of length is covered with the first portion of the insulator layer, therefore the problem caused by exposure of the transparent electrode by the patterned semiconductor photo-active layer, for example, a short-circuit of the second electrodes formed on the exposed part of the transparent electrode in the later process by direct contact, can be prevented.

Preferably, the second portion of the insulator layer is formed so as to cover not only the upper surfaces of the collecting conductors but also the side surfaces thereof. In such a case, no accidental short-circuits occur when the collecting conductors are brought in contact with the second electrode even if the semiconductor photo-active layer is penetrated by the collecting conductors existing on the transparent electrode. Furthermore, since the collecting electrodes are completely covered by the second portion of the insulator layer, it does not occur that the element of the metal constituting the collecting conductors diffuses into the semiconductor photo-active layer. Therefore, the deterioration of the film quality which can occur when the amount of the dopant in the semiconductor photo-active layer is changed, or when the conductive type thereof is changed, does not happen.

Such a photovoltaic device can be manufactured by the following steps (a)-(f): (a) forming a plurality of spaced apart first electrode layers corresponding to a plurality of photoelectric conversion cells on said insulating surface of said substrate, said step (a) including the step (a-1) of forming a plurality transparent electrodes corresponding to said plurality of photoelectric conversion cells, and the step (a-2) of forming coupling conductors in a coupling region on said transparent electrodes so as to contact said transparent electrodes and collecting conductors extending from said coupling conductors onto said transparent electrodes, (b) forming an insulator layer including first portions arranged in dividing regions for dividing into said plurality of photoelectric conversion cells and second portions covering said collecting conductors, (c) forming a continuous semiconductor photo-active layer on said substrate so as to cover said plurality of first electrode layers and said insulator layers, (d) forming a continuous second electrode on said semiconductor photo-active layer, (e) separating said semiconductor photo-active layer and said second electrode into portions corresponding to each photoelectric conversion cell by irradiating a first energy beam onto said insulator from above each said second electrode, and (f) connecting the second electrode of each photoelectric conversion cell to the first electrode of an adjacent photoelectric conversion cell through said coupling conductor by irradiating a second energy beam onto each said coupling conductor from above each said second electrode.

In addition, if the first portion of the insulator layer is formed so as to sandwich the coupling conductor, one of the first portions sandwiching the coupling conductor may be formed at the interval between the transparent electrodes. Thereby, the interval between the transparent electrodes is filled with the insulator, and thereby leakage current between the adjacent photoelectric conversion cells can be suppressed, and therefore the degree of integration in the direction of length of the photoelectric conversion array can be further raised by narrowing the intervals.

These objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 5A through FIG. 11 are illustrative views showwin one embodiment in accordance with the present invention in the sequence of manufacturing processes, wherein FIG. 5A is a top plan view, FIG. 11 is a partially magnified top plan view showing a formation of the coupling conductor and the first portion of the insulator layer in the process as shown in FIGS. 7A–8B.

FIG. 12 through FIG. 17 are illustrative views showing another embodiment in accordance with the present invention in the sequence of manufacturing processes, wherein FIG. 12 is a partially cross-sectional view of the photovoltaic device completed in accordance with this embodiment, and FIGS. 13-17 are partially cross-sectional views of the device during manufacturing processes.

DESCRIPTION OF THE PREFERRED EMBODIMENTS

Figure 1:
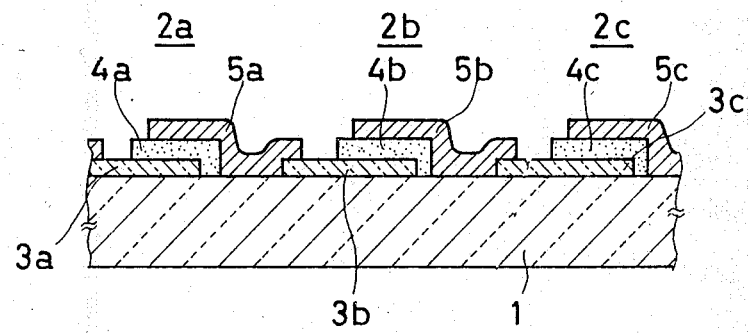
FIG. 1 is a cross-sectional view showing a basic structure of a photovoltaic device which is the background of the present invention and whereto the present invention is applicable.
Figure 2:
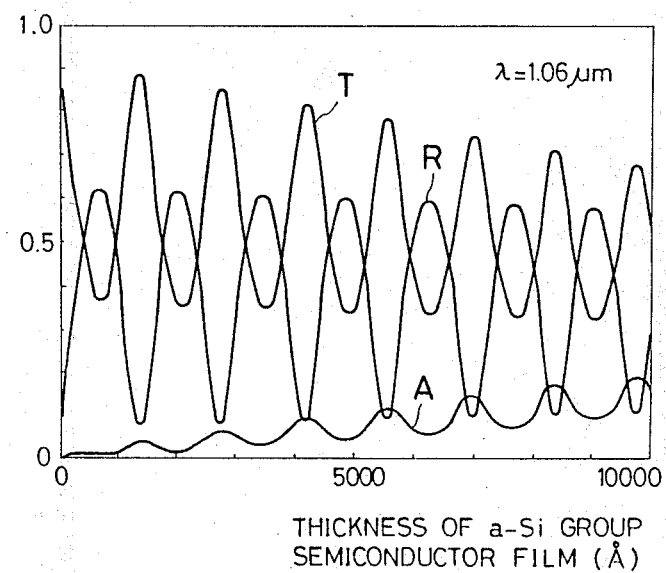
FIG. 2 is a graph for optically analyzing the dependence of the absorption factor A, the reflection factor R, and the transmission factor T of the laser beam on the film thickness of the semiconductor photo-active layer.
Figure 3:
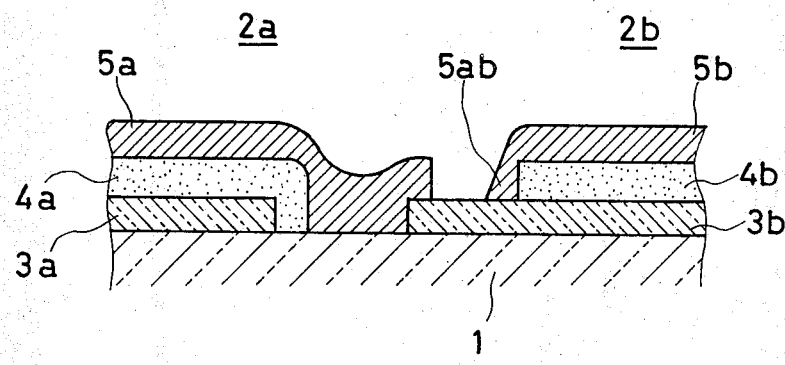
FIG. 3 and FIG. 4 are magnified fragmental sectional views for explaining conventional defects, respectively.
Figure 4:
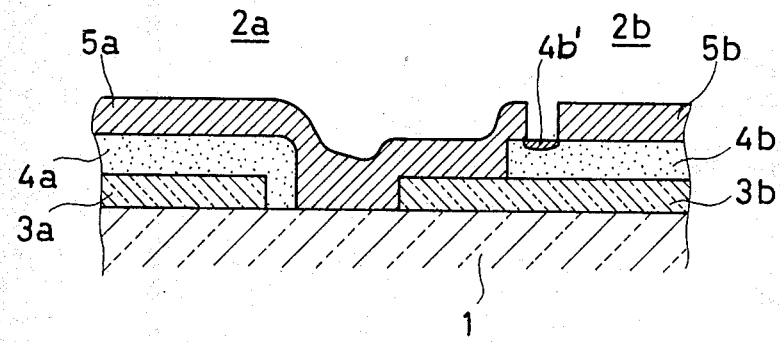
Figure 5A:
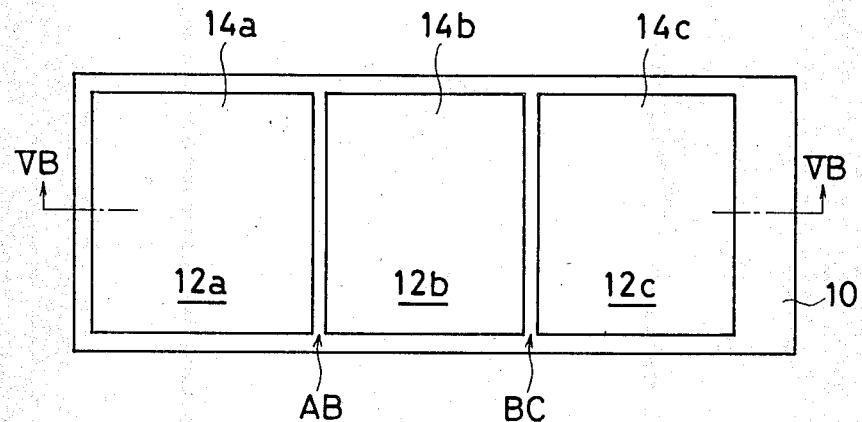
Figure 5B:
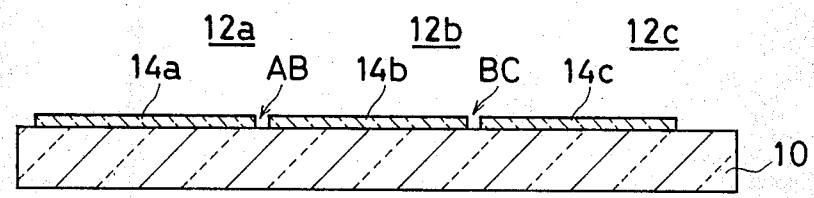
FIG. 5B is a cross-sectional view of FIG. 5A along the line VB—VB

In the first process of the first embodiment, as shown in FIGS. 5A and 5B, a transparent substrate 10 such as glass of about 1–5 mm in thickness and 10 cm by 10 cm to 50 cm by 50 cm in area is prepared. Then, a single layered or laminated multi-layer transparent conductive oxide (TCO) film of 2,000Å–5,000Å in thickness typified by tin oxide ($SnO_2$) or indium tin oxide (ITO) is formed on the whole of one main surface of this substrate 10. Thereafter, a laser beam is irradiated onto interval portions AB, BC, — corresponding to intervals between respective photoelectric conversion cells 12a, 12b, 12c, —, and the transparent electrode layers at these parts are removed to form individual transparent electrodes 14a, 14b, 14c, —, respectively. A laser apparatus which generates a laser beam of a wavelength which is not significantly absorbed by the substrate 10 is suitable for this use, and in the case where the substrate 10 is glass, a pulse-output type laser apparatus of 0.35 $\mu$m–2.5 $\mu$m in wavelength is suitable. In the embodiment, a Q switched Nd:YAG laser of about 1.06 $\mu$m in wavelength, 13 J/cm$^2$ in energy density, and 3 KHz in pulse frequency was employed.

Figure 6A:
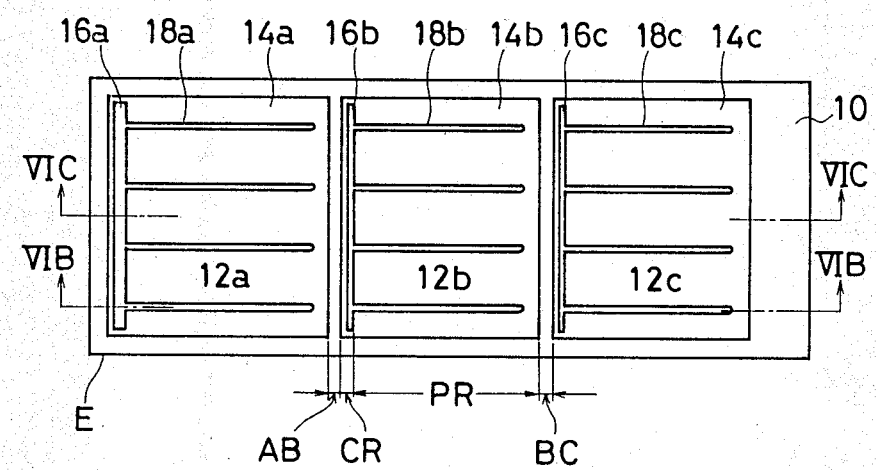
FIG. 6A is a top plan view.
Figure 6B:
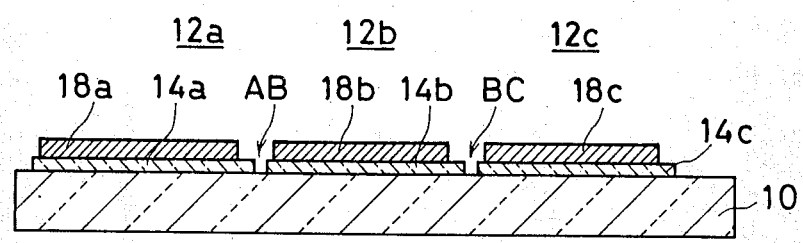
FIGS. 6B and 6C are cross-sectional views of FIG. 6A along the lines VIB—VIB and VIC—VIC, respectively.
Figure 6C:
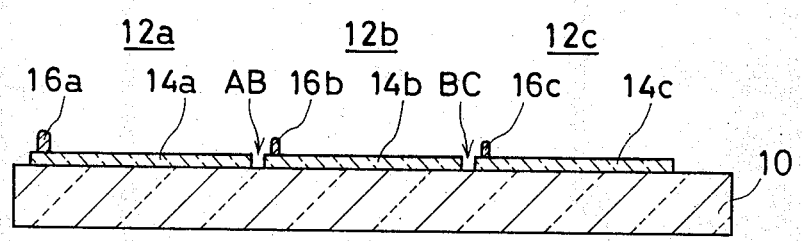

In the process shown in FIGS. 6A–6C, coupling conductors 16a, 16b, 16c, — are formed on the transparent electrodes 14a, 14b, 14c, — in the vicinity of the interval portions AB, BC, — between the transparent electrodes 14a, 14b, 14c, — which are separated from one another, and a plurality of collecting conductors 18a, 18b, 18c, — are formed on the respective ones of the transparent electrodes 14a, 14b, 14c, — so as to be distributed thereon and extend from the coupling conductors 16a, 16b, 16c, —. More specifically, in the vicinity of one end portion E and the interval portions AB, BC, —, that is, on the coupling region CR, coupling conductors 18a, 18b, 18c, — are formed so as to extend in parallel with the direction of length of the photoelectric conversion cells 12a, 12b, 12c, —. Also, on the transparent electrodes 14a, 14b, 14c, —, the respective plurality of collecting conductors 18a, 18b, 18c, — are formed such that end of the respective collecting conductors 18a, 18b, 18c, — is connected to the corresponding coupling conductors 16a, 16b, 16c, — and the other end thereof extends in the direction of length of the photoelectric conversion cells 12a, 12b, 12c, —.

For the conductors, for example, silver paste or another low-temperature-baked type metal paste is used.

The coupling conductors 16a, 16b, 16c, — and collecting conductors 18a, 18b, 18c, — are both patterned to be 10–20/$\mu$m in height and 100–150/$\mu$m in width, for example, by screen printing method, and thereafter undergo preliminary drying.

Figure 7A:
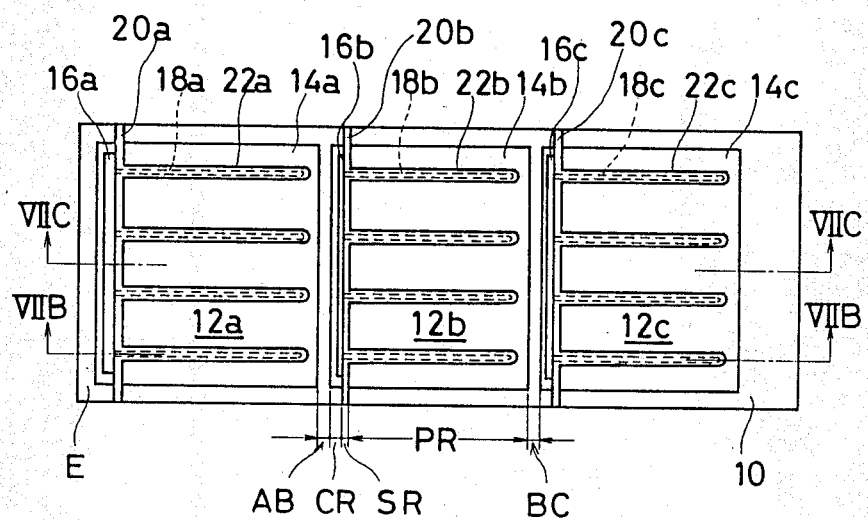
FIG. 7A is a top plan view.
Figure 7B:
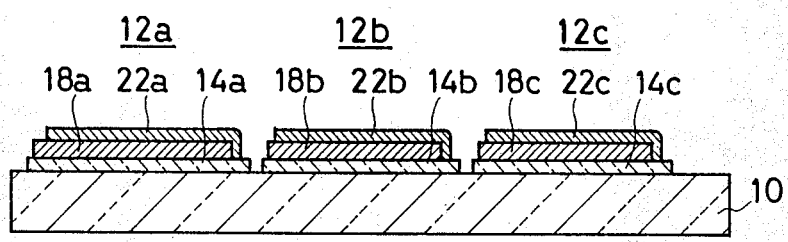
FIGS. 7B and FIG. 7C are cross-sectional views of FIG. 7A along the lines VIIB—VIIB and VIIC—VIIC.
Figure 7C:
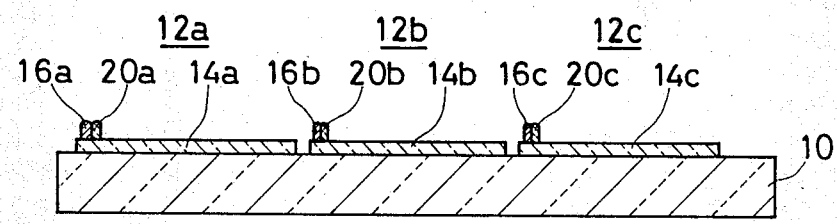

In the process as shown in FIGS. 7A-7C, an insulator layer is formed which includes first portions 20a, 20b, 20c, — formed in the vicinity of the coupling conductors 16a, 16b, 16c, —, that is, in a separating region SR, in parallel therewith, and second portions 22a, 22b, 22c, — formed so as to cover all of the upper surfaces and the side surfaces of the respective collecting conductors 18a, 18b, 18c, —. In this embodiment, the first portions are arranged closely in contact with the coupling conductors 16a, 16b, 16c, —, but the both may be formed so as to be spaced apart at very small intervals.

For the insulator layers, a paste-like material which does not diffuse into an amorphous silicon film which is formed in a later process and functions as a semiconductor photo-active layer 24, for example, $SiO_2$ paste wherein silicon dioxide ($SiO_2$) powder is formed into a paste or another paste of inorganic material is selected.

The first portions 20a, 20b, 20c, — and second portions 22a, 22b, 22c, — of the insulator layer are both patterned to be 10-20/μm in height and 100-300/μm in width, for example, by a screen printing method, and thereafter undergo preliminary drying. Then, the insulator layer and the previously formed coupling conductors 16a, 16b, 16c, — and collecting conductors 18a, 18b, 18c, — are simultaneously subjected to firing at a temperature of about 550° C. Meanwhile, in order to cover the entire surfaces of the collecting conductors 18a, 18b, 18c, —, the second portions 22a, 22b, 22c, — are formed wider than the first portions 20a, 20b, 20c, —.

When the baking temperatures for the conductors and for the insulator layers are the same as mentioned above, both are baking simultaneously. However, even when both are baked simultaneously, the conductors and the insulator layers cannot be screen printed simultaneously, and therefore it is required that the conductor paste or the insulator paste is first screen-printed, and subsequently the preliminary drying is applied to this screen-printed paste, and thereafter the remaining insulator paste or conductor paste is screen-printed.

The conductor paste and insulator paste can also be printed or formed, for example, by the pen-drawing method.

Figure 11:
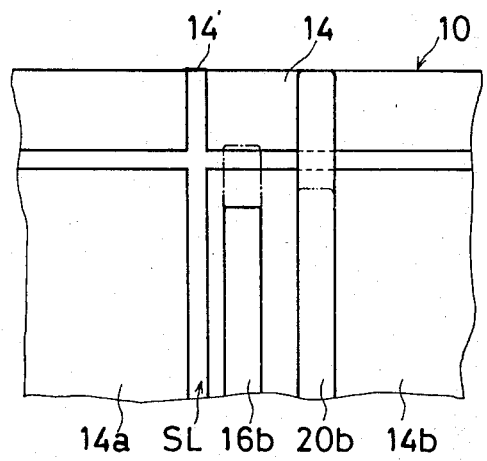

Also, in the process as shown in FIGS. 6A-6C and FIGS. 7A and 7C, as shown in FIG. 11, the coupling conductors 16a, 16b, 16c, — are formed so as to be positioned inside from the ends of the transparent electrodes 14a, 14b, 14c, — in the direction of width of the photoelectric conversion cells 12a, 12b, 12c, —. This means that the coupling conductors 16a, 16b, 16c, — are formed so as not to extend from the ends in the direction of width of the transparent electrodes 14a, 14b, 14c, — whereon the respective conductors are formed. Conversely, the first portions of the insulator layers 20a, 20b, 20c, — are formed so as to extend from the ends of the transparent electrodes 14a, 14b, 14c, — in the direction of width thereof.

The reason for forming the coupling conductors 16a, 16b, 16c, — in such a shape is as follows: The transparent electrode is formed on the whole surface of the substrate 10, thereafter being laser-scribed at a scribe line SL as shown in FIGS. 5A and 5B, that is, FIG. 11. At this time, the transparent electrode 14 remains on the edge of the substrate 10, and the adjacent transparent electrodes are connected to one another by a segment 14' of the transparent electrode 14 remaining on the side edge of the substrate 10. In such a case, if the coupling conductor 16a extends from the transparent electrode 14a as shown by a dash-dot line in FIG. 11, the extending portion of the conductor is connected electrically to the adjacent transparent electrode and thus to the conductor thereon through the remaining transparent electrode portion 14'.

On the other hand, the reason for forming the first portions 20a, 20b, 20c, — so as to extend from the edge of the transparent electrodes 14a, 14b, 14c, — in the direction of length of the photoelectric conversion cells 12a, 12b, 12c, — is that if the end of the first portion 20a is positioned inside the transparent electrode 14a as shown by a dash-colon line in FIG. 11, the transparent electrode is exposed at that portion by the first insulator 20a, and the back electrode 26 to be formed in the later processing is electrically connected directly to the transparent electrode at that portion by irradiation of the laser beam.

Figure 8A:
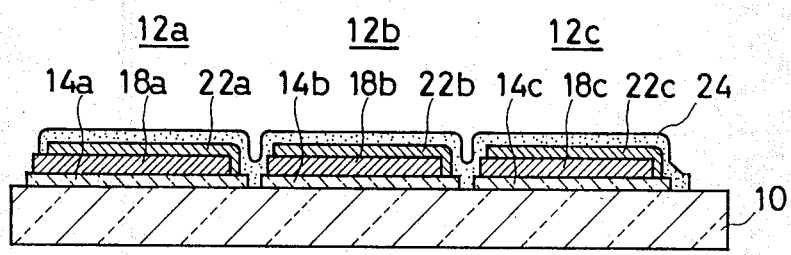
FIGS. 8A, 9A and 10A are respectively cross-sectional views corresponding to FIG. 7B, FIGS. 8B, 9B and 10B are respectively cross-sectional views corresponding to FIG. 7C.
Figure 8B:
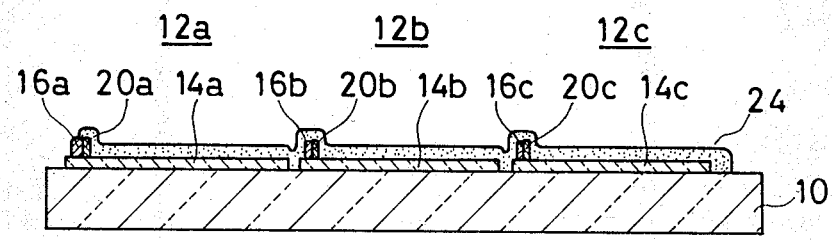

Next, as shown in FIGS. 8A and 8B, a semiconductor photo-active layer 24 is formed on nearly the whole of the main surface of the substrate 10 so as to cover the respective transparent electrodes 14a, 14b, 14c, —, the coupling conductors 16a, 16b, 16c, —, collecting conductors 18a, 18b, 18c, — and the first portions 20a, 20b, 20c, — and the second portions 22a, 22b, 22c, — of the insulator layers. This semiconductor photo-active layer 24 is formed of an amorphous semiconductor, for example, amorphous silicon, and the film thickness thereof is selected at 4,000 Å-7,000 Å so as to contribute effectively to photoelectric conversion.

The semiconductor photo-active layer 24 comprises, for example, a PIN junction parallel with the film surface. Such a PIN junction is formed by the plasma CVD method or the photo CVD method in a reaction gas composed of a main gas of a silicon compound such as monosilane ($SiH_4$), disilane ($Si_2H_6$), silicon tetrafluoride ($SiF_4$) or monofluorosilane ($SiH_3F$) and a doping gas such as diborane ($B_2H_6$) or phosphine ($PH_3$) which is added suitably for controlling the conductivity type. Specifically, diborane and a further hydrocarbon gas such as methane ($CH_4$) or ethane ($C_2H_6$) is added to the silicon compound gas as described above, and thereby P-type amorphous silicon carbide (a-SiC) is formed using the plasma CVD method or the photo CVD method, and subsequently I-type amorphous silicon (a-Si) is formed, and further N-type amorphous silicon or microcrystalline silicon (μc-Si) is formed.

Also, for the semiconductor photo-active layer 24, a film-type semiconductor such as of cadmium sulfide (CdS), cadmium telluride (CdTe), or selenium (Se) may be used, in addition to the amorphous silicon derivatve semiconductors as described above. Practically, however, the above-described amorphous silicon and amorphous silicon carbide, and further the amorphous silicon derivative semiconductors typified by amorphous silicon germanium (a-SiGe) or amorphous silicon tin (a-SiSn) are suitable for this layer.

Figure 9A:
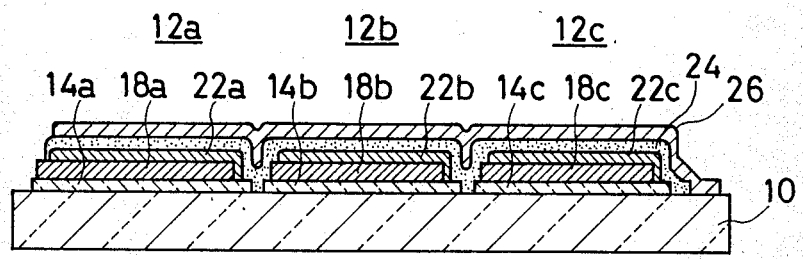
Figure 9B:
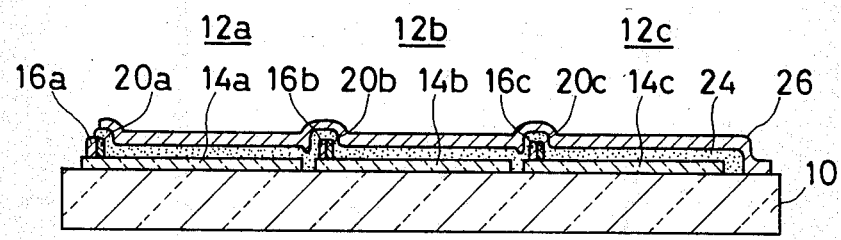

In the process as shown in FIGS. 9A and 9B, the semiconductor photo-active layer 24 formed in the process in FIGS. 8A and 8B is not scribed, that is, immediately after forming the semiconductor photo-active layer 24, a back electrode layer 26 having, for example, a film thickness of about 1000 Å-2 μm is formed on the substrate 10 including the semiconductor photo-active layer 26 and the respective exposed portions of the transparent electrodes 14a, 14b, 14c, —. For such a back electrode 26, a single-layer structure of aluminum, a double-layer laminate structure of aluminum and titanium (or titanium-silver alloy) or a dual structure including both such double-layer structures in stacked fashion is used.

Thus, the back electrode 26 is formed on the whole surface of the semiconductor photo-active layer 24 immediately after formation thereof, and therefore not only adhesion of dust and dirt onto the semiconductor photo-active layer 24 can be effectively prevented, but also an increase in sheet resistance due to re-adhesion of the debris scattered during scribing performed in the later processing, and further a deterioration in film characteristics of the semiconductor photo-active layer 16 due to moisture in the oxidizing air, can be effectively prevented.

Figure 10A:
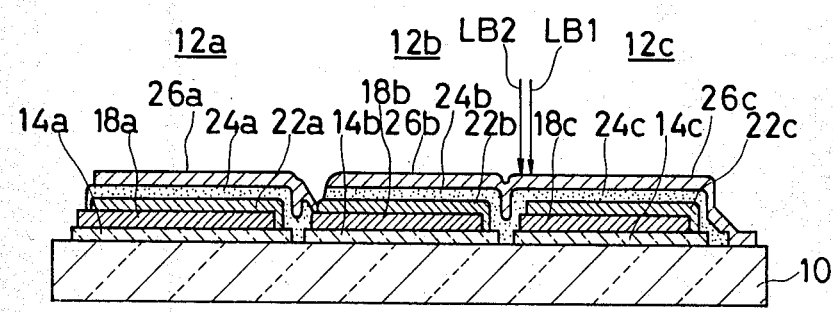
Figure 10B:
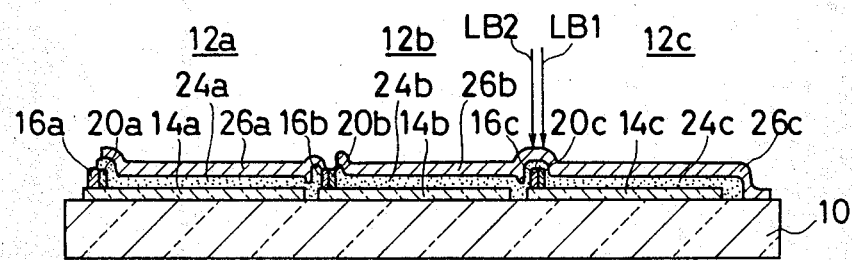

In the final process shown in FIGS. 10A and 10B, two laser beams LB1 and LB2 are irradiated onto the portion of the semiconductor photo-active layer 24 and back electrode 26 laminate located on the coupling conductors 16a, 16b, 16c, — and the first portions 20a, 20b, 20c, — of the insulator layer above the back electrode 18.

Figure 10C:
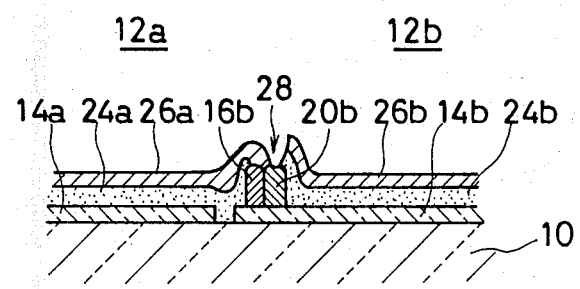
FIG. 10C is a magnified cross-sectional view of a major portion of FIG. 10B.

The portions whereon the first laser beam LB1 is irradiated are the portions to be removed so as to separate the lamination of the semiconductor photoactive layer 24 and the back electrode 26 extending over a plurality of photoelectric conversion cells 12a, 12b, 12c, — corresponding to the respective photoelectric conversion cells 12a, 12b, 12c, — and these portions are the positions directly over the first portions 20a, 20b, 20c, —. The energy density of the first laser beam LB1 is set to an energy density sufficient to remove those portions of the semiconductor photo-active layer 24 and back electrode 26 lamination. Even if the energy density of the laser beam LB1 is set at a higher level, the laser beam LB1 having such a high energy density reaches only the surfaces of the first portions 20a, 20b, 20c, —, and never reaches the underlying transparent electrodes 14a, 14b, 14c, — because of the presence of the first portions 20a, 20b, 20c, — whose thickness (height) is sufficiently large beneath the above-described laminated portion as shown in FIG. 10C. Then, the lamination of the semiconductor photo-active layer 24 and the back electrode 26 is separated completely, corresponding to the respective photoelectric conversion cells 12a, 12b, 12c, — by the separating grooves 28 formed therein by means of irradiation of the laser beam LB1.

On the other hand, the energy density of the second laser beam LB2 irradiated onto the coupling conductors 16a, 16b, 16c, — is set to an energy density sufficient to melt the portion of the semiconductor photo-active layer 24 and back electrode 26 lamination over the coupling conductors 16a, 16b, 16c, —. Then, the silicide alloy produced by melting contacts the coupling conductors 16a, 16b, 16c, — located beneath so as to penetrate the intervening semiconductor photoactive layer 24. As is described above, the coupling conductors 16a, 16b, 16c, — are metal conductors formed by sintering silver paste or another metal paste, and therefore they are strongly bonded to the melt containing metal. Also, since these coupling conductors 16a, 16b, 16c, — have a sufficient thickness (height), the underlying transparent electrodes 14a, 14b, 14c, — are never damaged by the second laser beam LB2.

In the process shown in FIGS. 10A and 10B, a single laser device can be employed for irradiating the two laser beam LB1 and LB2 having different energy densities as described above. For example, the same laser apparatus can be employed by varying the focus position to adjust the respective spot diameters of the laser beam LB1 and LB2, or by adjusting the output by means of an attenuator. Furthermore, if the laser apparatus has a sufficient output, one laser beam can be split into the two laser beam LB1 and LB2, for example, by means of a beam splitter or the like. In this case, the number of times of laser beam scanning will be halved.

Thus, the process of removing the unnecessary portions of the semiconductor photo-active layer 24 and the back electrode 26 thereby to separate them corresponding to the respective photoelectric conversion cells 12a, 12b, 12c, — and the process wherein the back electrodes 26a, 26b, 26c, — and the transparent electrodes 14b, 14c, — of the adjacent photoelectric conversion cells 12b, 12c, — are connected electrically can be accomplished virtually by the same process.

After undergoing the process shown in FIG. 10, the adjacent back electrodes 14b, 14c, — of the respective photoelectric conversion cells 12a, 12b, 12c, — are connected electrically at the side nearer to the adjacent interval portions AB, BC, —(FIG. 5A) by means including the above-described separating grooves 28. Accordingly, the respective photoelectric conversion cells 12a, 12b, 12c, — are electrically connected in series through back electrodes 26a, 26b, 26c, —, coupling conductors 16a, 16b, 16c, — and transparent electrodes 14b, 14c, —, and thereby a photovoltaic device 10 is completed.

Figure 12:
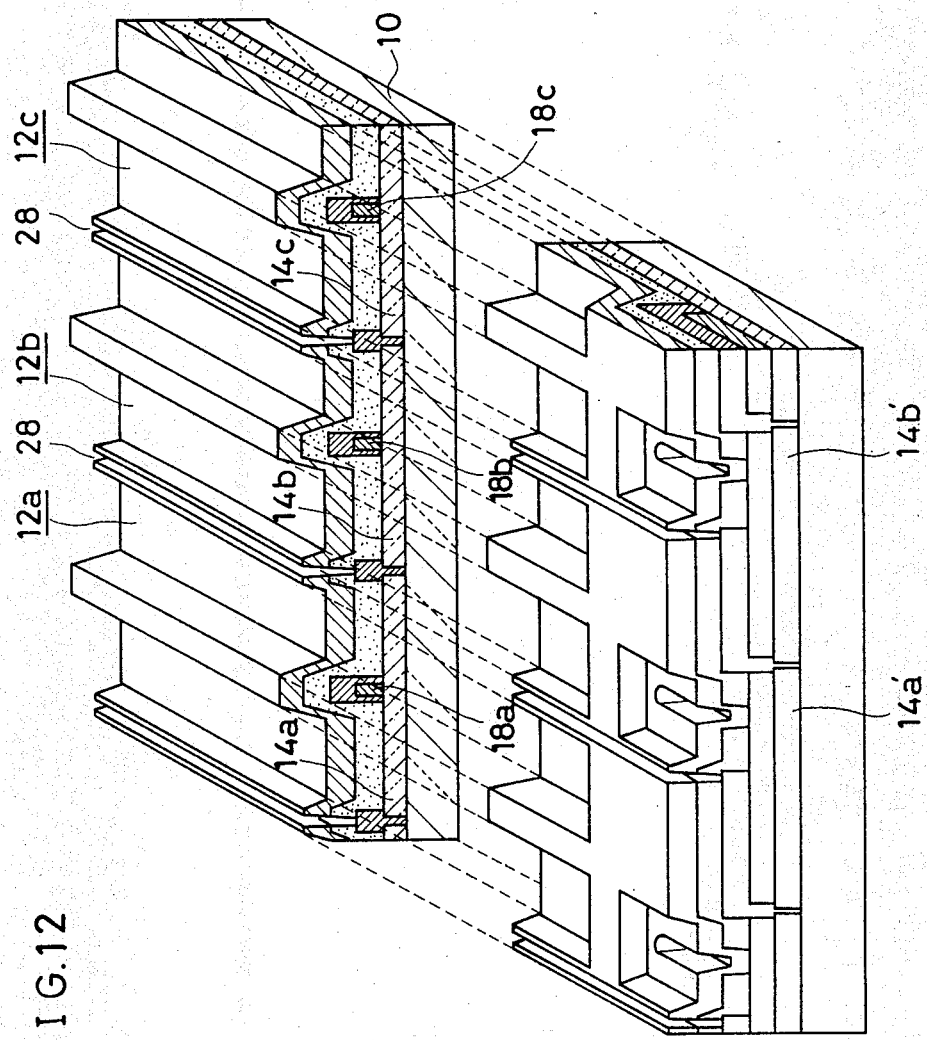

Next, description will be made of the other embodiment of the present invention with reference to FIG. 12 through FIG. 17. FIG. 12 is a partially cross-sectional perspective view showing the completed state of the embodiment device in viewing from the direction opposite to the incidence of light, that is, in a back side direction, and FIGS. 13-17 are perspective views showing a major portion of the embodiment in the sequence of manufacturing processes. The feature of the embodiment resides in that an electrical series connection of adjacent photoelectric conversion cells 12a, 12b, 12c, — is performed at the coupling region CR' of the side edge portion of the substrate 10 instead of the coupling region CR at the intervals between adjacent cells. Therefore, it is pointed out in advance that the edge portion of the substrate 10 is mainly illustrated in FIG. 13 through FIG. 17 and the other portions may be omitted.

Figure 13:
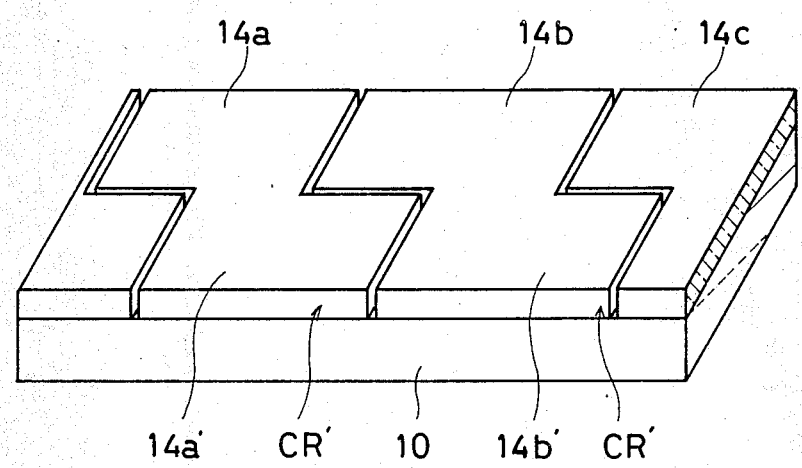

First, in the process as shown in FIG. 13, a transparent electrode film is separated or divided into transparent electrodes 14a, 14b, 14c, — corresponding to the respective photoelectric conversion cells 12a, 12b, 12c, — by irradiating a laser beam. The respective transparent electrodes 14a, 14b, 14c, — include extended portions 14a', 14b' bent toward the coupling region CR' which is coupled to the adjacent cells 12b, 12c, — at the right side for series connecting the photoelectric conversion cells 12a, 12b, 12c, —.

Figure 14:
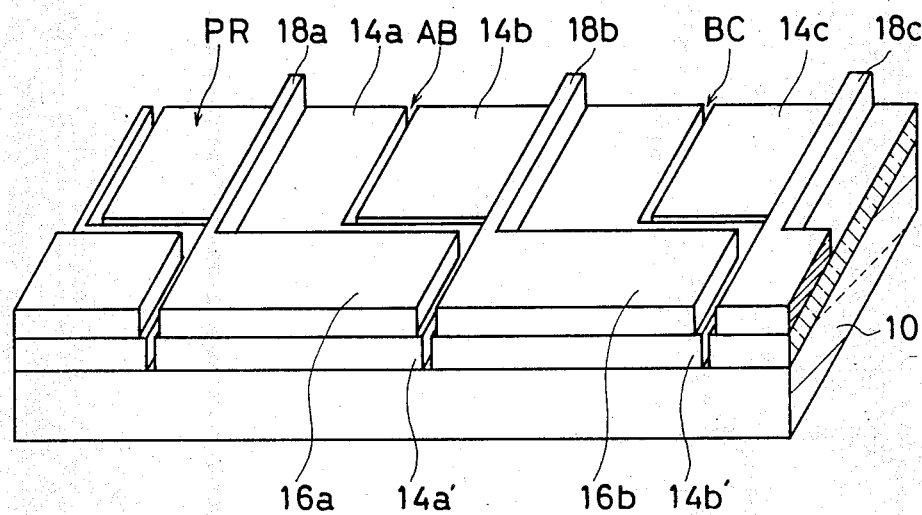

In the process as shown in FIG. 14, coupling conductors 16a, 16b, — and collecting conductors 18a, 18b, 18c, — extending toward the photoreceiving region PR, both of which are composed of a metal paste such as a silver paste, are simultaneously formed by screen printing.

Figure 15:
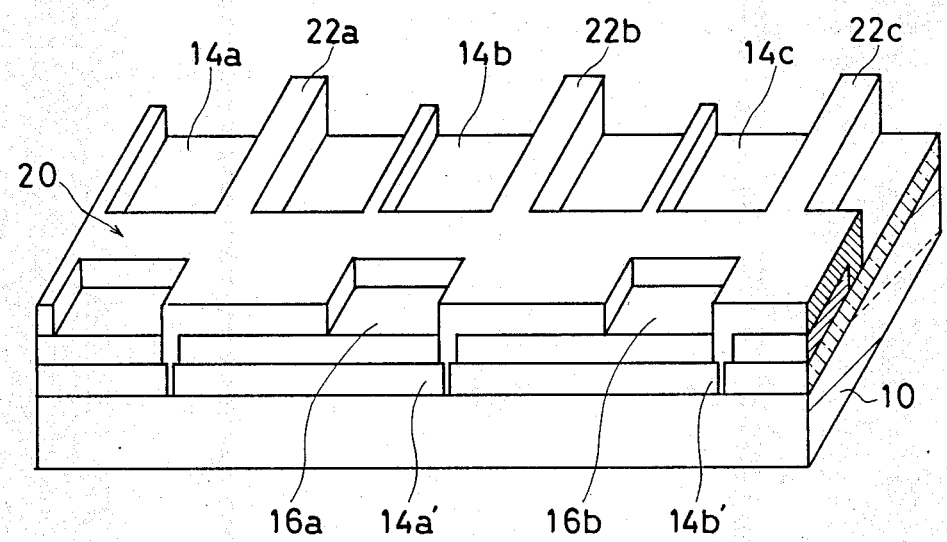

In the process as shown in FIG. 15, a first portion 20 and second portions 22a, 22b, 22c, — of an insulator layer composed of a paste of $SiO_2$ or the like are formed by a screen printing so as to cover the separating regions AB, BC, — of the collecting conductors 18a, 18b, 18c, — and the transparent electrodes 14a, 14b, 14c, —. In this process, insulator film is not formed on a portion of the coupling conductors 16a, 16b, — associated with the collecting conductors 18a, 18b, 18c, —, and therefore the portions of the coupling conductors 16a, 16b, — are exposed so as to define the coupling region CR'.

Figure 16:
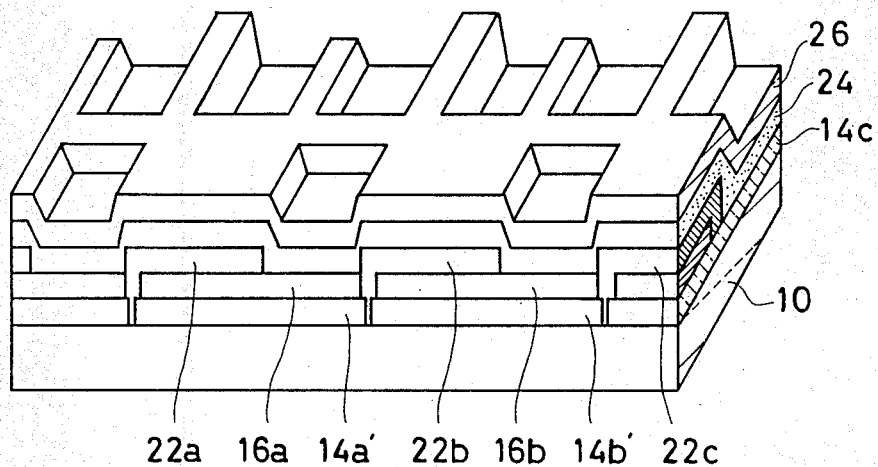

In the process as shown in FIG. 16, a semiconductor photo-active layer 24 and back electrode 26 are formed on the substrate 10 so as to cover the respective transparent electrodes 14a, 14b, 14c, —, the coupling conductors 16a, 16b, 16c, — and the second portions 22a, 22b, 22c, — and continued over the plurality of photoelectric conversion cells 12a, 12b, 12c, —.

Figure 17:
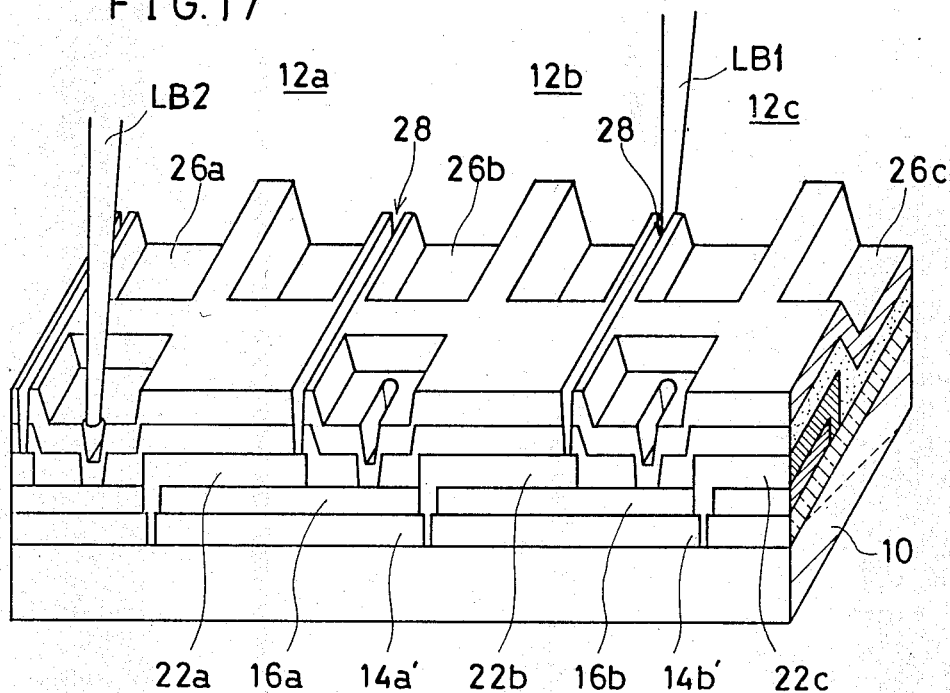

In the process as shown in FIG. 17, laser beam LB1 is irradiated onto the portion of the back electrode and the semiconductor photo-active layer laminate above the back electrode 26 so as to form an separating groove 28 for separating the back electrodes 26a, 26b, 26c, — and the semiconductor photo-active layers 24a, 24b, 24c, — which correspond to the respective photoelectric conversion cells 12a, 12b, 12c, —. In addition, laser beam LB2 is irradiated onto the portion of the coupling region CR' above the back electrode 26 so as to electrically couple the portion of the back electrodes and the coupling conductors 16a, 16b, — existing beneath thereof. Thus, a photovoltaic device is completed, in which the adjacent photoelectric conversion cells 12a, 12b, 12c, — are electrically connected in series as shown in FIG. 12.

Figure 18:
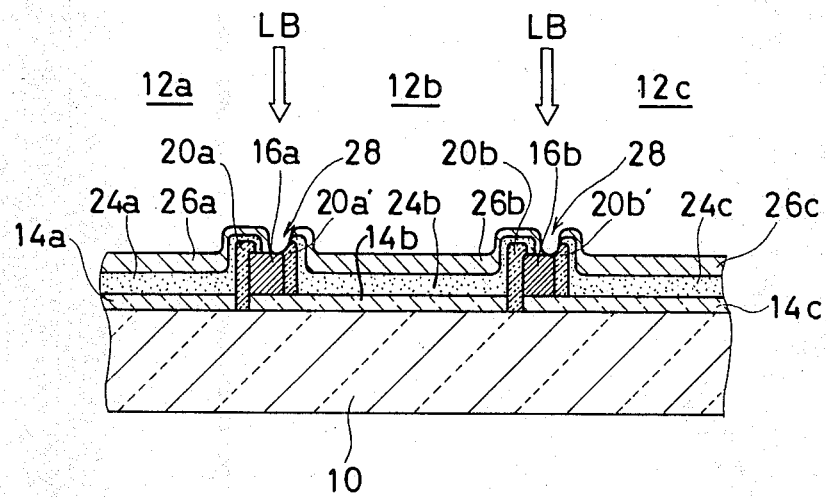
FIG. 18 is a cross-sectional view showing a modified example of the embodiment as shown in FIGS. 5A-11.

FIG. 18 shows a modification of the embodiment shown in FIG. 5A through FIG. 11. In the FIG. 18 embodiment, the coupling conductors 16a, 16b, — are formed on the transparent electrodes 14a, 14b, 14c, — in the vicinity of the interval portions AB, BC, — between the transparent electrodes 14a, 14b, 14c, —. Furthermore, the first portions 20a, 20a', 20b, 20b' — are formed on the adjacent interval portions and transparent electrodes 14b, 14c, — so as to sandwich the coupling conductors 16a, 16b, —. These coupling conductors 16a, 16b, — and first portions of the insulator layer 20a, 20a', 20b, 20b', — are formed so as to extend in parallel with the direction of width of the photoelectric conversion cells 12a, 12b, 12c, —. In addition, it is desirable that the respective tips of the first portions 20a, 20a', 20b, 20b', — extend onto the coupling conductors 16a, 16b, —. By forming them in such a shape, the coupling conductors 16a, 16b, — are wrapped by the insulators, and thereby an advantage is obtained in that migration of silver and diffusion of the same into the semiconductor photo-active layer can be effectively prevented.

These coupling conductors 16a, 16b, — and the first portions 20a, 20a', 20b, 20b', — are patterned to be 10-20 μm in height and 100-200 μm in width, for example, by the screen printing method as in the previous embodiment, thereafter being baked at a temperature of about 550° C.

Thereafter, the semiconductor photo-active layer 24 is formed on nearly the entire main surface of the substrate 10 so as to cover the respective transparent electrodes 14a, 14b, 14c, —, the coupling conductors 16a, 16b, and the first portions 20a, 20a', 20b, 20b', —. The semiconductor photo-active layer 24 as formed is not scribed, and immediately after the semiconductor photo-active layer 24 is formed, the back electrode 26 is formed on the substrate 10 including the semiconductor photo-active layer 24 and the respective exposed portions of the transparent electrodes 14a, 14b, 14c —.

In the final process, the laser beam LB is irradiated onto the positions where the coupling conductors 16a, 16b, — and the first portions 20a, 20b, — are superposed on each other, that is, onto portions of the lamination of the semiconductor photoactive layer 24 and the back electrode 26 from above the back electrode 26.

The portions whereon this laser beam LB is irradiated are the portions to be removed so as to separate the lamination of the semiconductor photoactive layer 24 and the back electrode 26 extending over a plurality of photoelectric conversion cells 12a, 12b, 12c, — corresponding to the respective photoelectric conversion cells 12a, 12b, 12c, —. The energy density of the laser beam LB is set to an energy density sufficient to remove the laminated portions. Even if the energy density of the laser beam is set to a higher level, the laser beam of such a high energy density is prevented from reaching the underlying transparent electrodes 14a, 14b, 14c, — because of the presence of the coupling conductors 16a, 16b, — and the first portions 20a', 20b', — whose thicknesses (heights) are sufficiently large beneath the above-described laminated portions. Then, by this irradiation of the laser beam LB, the lamination of the semiconductor photo-active layer 24 and the back electrode 26 is separated completely, corresponding to the respective photoelectric conversion cells 12a, 12b, 12c, — by the dividing grooves 28 formed therein.

On the other hand, since the laser beam LB has a sufficiently large energy density, the back electrodes 26a, 26b, 26c, — in the vicinity of the separating grooves 28 are melted by the irradiation thereof. Such melting of the back electrodes 26a, 26b, 26c, — takes place at both sides of the dividing grooves 28, and the melt droops in the direction of narrowing the dividing grooves 28, reaching the coupling conductors 16a, 16b, — and the first portions 20a, 20b, —. Consequently, the back electrodes 26a, 26b, 26c, — are connected electrically to the transparent electrodes 14b, 14c, — of the adjacent photoelectric conversion cells 12a, 12b, 12c, — through the coupling conductors 16a, 16b, — as in the previous embodiment.

Although the present invention has been described and illustrate in detail, it is clearly understood that the same is by way of illustration and example only and is not to be taken by way limitation, the spirit and scope of the present invention being limited only by the terms of the appended claims.

What is claimed is:

1. A photovoltaic device of the type including a plurality of photoelectric conversion cells formed as an array on a substrate having an insulate surface, each cell including a first electrode layer, a semiconductor photo-active layer, and a second electrode layer, said array comprising:

a plurality of spaced apart first electrode layers formed of said insulating surface of said substrate so as to define a plurality of separate photoelectric conversion cells, each of said first electrode layers including a transparent electrode, a coupling conductor formed in a coupling region on the transparent electrode, and at least one collecting conductor extending from the coupling conductor over the surface of the transparent electrode;

an insulator layer formed on a part of each of said transparent electrodes and including a first portion formed on a separating region for separating into said plurality of photoelectric conversion cells and a second portion covering said at least one collecting conductor;

a semiconductor photo-active layer formed on said substrate so as to cover each one of said first electrode layers and said insulator layers; and a second electrode layer formed on each one of said semiconductor photo-active layers;

wherein, said semiconductor photo-active layer and said second electrode layer are separated to define each photoelectric conversion cell by irradiating a first energy beam onto respective said first portions of insulator layer from above said second electrode layer, and the second electrode of each photoelectric conversion cell being connected to the transparent electrode of the first electrode layer of an adjacent photoelectric conversion cell through said coupling conductor by irradiating a second energy beam onto each said coupling conductor from above each said second electrode.

2. A photovoltaic device in accordance with claim 1, wherein said coupling conductors are formed on the edge portions of said transparent electrodes and said first portions of said insulator layers are formed in the vicinity of said coupling conductors.

3. A photovoltaic device in accordance with claim 2, wherein said coupling conductors extend along the width of said transparent electrodes and terminate inwardly of said transparent electrodes in the direction of width thereof.

4. A photovoltaic device in accordance with claim 2 wherein said first portions of said insulator layer extend along the width of said transparent electrodes and beyond said transparent electrodes in the direction of width thereof.

5. A photovoltaic device in accordance with claim 2, wherein said coupling conductors and said first portions of said insulator layer extend along the width of said transparent electrodes.

6. A photovoltaic device in accordance with claim 1, wherein said transparent electrodes include extended portions extending to the adjacent photoelectric conversion cell over said separating region at one end thereof, and said coupling conductors are formed on said extended portions.

7. A photovoltaic device in accordance with claim 6, wherein said insulator layer is formed on each one of said coupling conductors except for a portion of the respective coupling conductors, said portion of the coupling conductors functioning as said coupling region.

8. A photovoltaic device in accordance with claim 1, wherein said coupling conductors and said collecting conductors are formed by sintering a conductive paste.

9. A photovoltaic device in accordance with claim 1, wherein said insulator layers are formed by sintering an insulating paste.

10. A method for fabricating a plurality of photoelectric conversion cells in a photovoltaic device including a substrate with an insulating surface, said method comprising the steps of:
(a) forming a plurality of spaced apart first electrode layers corresponding to a plurality of photoelectric conversion cells on said insulating surface of said substrate, said step (a) including the step (a-1) of forming a plurality of transparent electrodes corresponding to said plurality of photoelectric conversion cells, and (a-2) of forming coupling conductors in coupling regions on said transparent electrodes so as to contact said transparent electrodes and collecting conductors extending from said coupling conductors over the surface of the respective transparent electrode;
(b) forming insulator layers on each transparent electrode including first portions arranged in separating regions for separating into said plurality of photoelectric conversion cells and second portions covering said collecting conductors;
(c) forming a continuous semiconductor photo-active layer on said substrate so as to cover said plurality of first electrode layers and said insulator layers;
(d) forming a continuous second electrode on said semiconductor photo-active layer;
(e) separating said semiconductor photo-active layer and said second electrode into portions corresponding to each photoelectric conversion cell by irradiating a first energy beam onto respective said first portions of said insulator layers from above said second electrode; and
(f) connecting the second electrode of each photoelectric conversion cell to the transparent electrode of an adjacent photoelectric conversion cell through said coupling conductor by irradiating a second energy beam onto each said coupling conductor from the above said second electrode.

11. A method in accordance with claim 10, wherein said step (b) comprises forming said insulator layer under said semiconductor photo-active layer.

12. A method in accordance with claim 11, wherein said step (c) comprises forming said semiconductor photo-active layer after said insulator layers are formed.

13. A method in accordance with claim 10, wherein said step (a-1) comprises forming a transparent electrode layer on said insulating surface of said substrate and separating the transparent electrode layer into a plurality of spaced transparent electrodes corresponding to a plurality of said photoelectric conversion cells, and said step (a-2) comprises forming said coupling conductor and said collecting conductor on each one of said transparent electrodes.

14. A method in accordance with claim 13, wherein said step (a-2) comprises forming a conductive paste on each transparent electrode and sintering the formed conductive paste.

15. A method in accordance with claim 14, wherein said forming a conductive paste comprises printing the conductive paste.

16. A method in accordance with claim 15, wherein said printing a conductive step comprises printing a metal paste.

17. A method in accordance with claim 16, wherein said metal paste comprises a silver paste.

18. A method in accoradance with claim 10, wherein said step (b) comprises forming an insulating paste and sintering the formed insulating paste.

19. A method in accordance with claim 18, wherein said step (b) further corprises printing said insulating paste.

20. A method in accordance with claim 19, wherein said paste comprises inorganic material.

21. A method in accordance with claim 20, wherein said paste comprises a glass.

22. A method in accordance with claim 10, wherein in said step (a-2), said coupling conductor is formed so that it extends in the direction of width of said transparent electrode and terminates inwardly of said transparent electrode, and in said step (b), said first portion of said insulator layer is formed so that it extends in the direction of width of said transparent electrode and terminates beyond said transparent electrode in the direction of width thereof.

23. In a photovoltaic device of the type including a plurality of photoelectric conversion cells formed on a transparent substrate having an insulating surface:
a plurality of spaced-apart first electrode layers formed on said insulating surface of said substrate at locations corresponding to separate photoelectric conversion cells, each of said first electrode layer including a transparent electrode, a coupling conductor formed in a coupling region on the transparent electrode and a collecting conductor extending from the coupling conductor onto the surface of the transparent electrode;

an insulator layer formed on each one of said transparent electrodes and including a first portion formed on a separating region for separating into said plurality of photoelectric conversion cells and a second portion covering the collecting conductor; and a semiconductor photo-active layer formed on said substrate so as to cover each one of said first electrode layers and said insulator layers.

24. A photovoltaic device in accordance with claim 23, further comprising a plurality of second electrodes formed on each one of said semiconductor photo-active layers, the second electrode of each photoelectric conversion cell being connected through said coupling conductor to the transparent electrode of the first electrode layer of an adjacent photoelectric conversion cell.

25. In a method for manufacturing a photovoltaic device of the type including a plurality of photoelectric conversion cells formed on a transpaent substrate having an insulating surface, the steps of:

(a) forming a plurality of spaced-apart first electrodes on said insulating surface of said substrate, said step (a) including step (a-1) of forming a plurality transparent electrodes corresponding to said plurality of photo-electric conversion cells, and step (a-2) of forming coupling conductors in coupling regions on said transparent electrodes so as to contact said transparent electrodes and forming collecting conductors extending from said coupling conductors over the surface of the respective transparent electrode;

(b) forming insulator layers on each transparent electrode including first portions arranged in separating regions for separating into said plurality of photoelectric conversion cells and second portions covering said collecting conductors; and (c) forming a continuous semiconductor photo-active layer on said substrate so as to cover said plurality of first electrode layers and said insulator layers.

26. A method in accordance with claim 25, further comprising the steps of:

(d) forming a continuous second electrode on said semiconductor photo-active layer;

(e) separating said semiconductor photo-active layer and said second electrode into portions corresponding to each photoelectric conversion cell; and (f) connecting the second electrode of each photoelectric conversion cell to the transparent electrode of the first electrode layer of an adjacent photoelectric conversion cell through said coupling conductor.

* * * * *